(12) United States Patent
Shibasaki et al.

(10) Patent No.: US 12,224,367 B2
(45) Date of Patent: Feb. 11, 2025

(54) SOLAR CELL, MULTI-JUNCTION SOLAR CELL, SOLAR CELL MODULE, AND SOLAR POWER GENERATION SYSTEM

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Soichiro Shibasaki, Nerima (JP); Mutsuki Yamazaki, Yokohama (JP); Naoyuki Nakagawa, Setagaya (JP); Sara Yoshio, Yokohama (JP); Kazushige Yamamoto, Yokohama (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 464 days.

(21) Appl. No.: 16/288,932

(22) Filed: Feb. 28, 2019

(65) Prior Publication Data

US 2020/0091365 A1   Mar. 19, 2020

(30) Foreign Application Priority Data

Sep. 19, 2018 (JP) .................................. 2018-175274
Feb. 26, 2019 (JP) .................................. 2019-033073

(51) Int. Cl.
*H01L 31/0725* (2012.01)
*H01L 31/0224* (2006.01)
(Continued)

(52) U.S. Cl.
CPC .. *H01L 31/0725* (2013.01); *H01L 31/022425* (2013.01); *H01L 31/032* (2013.01); *H01L 31/042* (2013.01); *H02S 10/20* (2014.12)

(58) Field of Classification Search
CPC ......... H01L 31/0725; H01L 31/022425; H01L 31/032; H01L 31/042; H02S 10/20
(Continued)

(56) References Cited

U.S. PATENT DOCUMENTS 9,536,957 B2   1/2017   Abe et al.
9,761,673 B2   9/2017   Abe et al.
(Continued)

FOREIGN PATENT DOCUMENTS

| CN | 102214734 A | 10/2011 |
|---|---|---|
| JP | 2000-228516 | 8/2000 |
| JP | 2001-202820 | 7/2001 |
| JP | 2003-258278 | 9/2003 |
| JP | 3616824 | 11/2004 |
| JP | 2006-009083 | 1/2006 |
| JP | 2006-124753 | 5/2006 |

(Continued)

OTHER PUBLICATIONS

Fujinaka, Masaharu, et al.; Cuprous oxide-indium-tin oxide thin film photovoltaic cells; J. Appl. Phys. 54 (6), Jun. 1983, pp. 3582-3588 (Year: 1983).*

(Continued)

*Primary Examiner* — Devina Pillay
(74) *Attorney, Agent, or Firm* — Oblon, McClelland, Maier & Neustadt, L.L.P.

(57) ABSTRACT

According to one embodiment, a solar cell includes a first electrode, a second electrode, and a photoelectric conversion layer disposed between the first electrode and the second electrode. In a case where a photoluminescence spectrum of the photoelectric conversion layer is measured at a temperature of 100 K or lower, a first maximum value (A) which is a maximum value of emission intensity in a wavelength range of more than 650 nm and 1000 nm or less is 100 times or less of a second maximum value (B) which is a maximum value of emission intensity in a wavelength range of 600 nm or more and 650 nm or less (A≤100B).

12 Claims, 4 Drawing Sheets

(51) Int. Cl.
    *H01L 31/032*     (2006.01)
    *H01L 31/042*     (2014.01)
    *H02S 10/20*     (2014.01)

(58) Field of Classification Search
    USPC .......................................................... 136/265
    See application file for complete search history.

(56) References Cited

U.S. PATENT DOCUMENTS

| | | | | |
|---|---|---|---|---|
| 2009/0194157 | A1* | 8/2009 | den Boer | H01L 31/1884 |
| | | | | 136/256 |
| 2013/0263918 | A1* | 10/2013 | Konstantatos | H01L 31/03923 |
| | | | | 136/252 |
| 2015/0207012 | A1* | 7/2015 | Rogers | H01L 31/184 |
| | | | | 136/255 |

FOREIGN PATENT DOCUMENTS

| | | |
|---|---|---|
| JP | 2006-124754 | 5/2006 |
| JP | 2007-039729 | 2/2007 |
| JP | 2012-186415 | 9/2012 |
| JP | 2012-216780 | 11/2012 |
| JP | 2013-138165 | 7/2013 |
| JP | 2013-539234 | 10/2013 |
| JP | 2014-053572 | 3/2014 |
| JP | 2014-170865 | 9/2014 |
| JP | 2015-079881 A | 4/2015 |
| JP | 2015-162650 | 9/2015 |
| JP | 2016-192554 | 11/2016 |
| JP | 2017-098479 | 6/2017 |
| JP | 2018-046196 | 3/2018 |

OTHER PUBLICATIONS

Li, Junqiang, et al.; Engineering of optically defect free Cu2O enabling exciton luminescence at room temperature; Optical Materials Express; vol. 3, No. 12, pp. 1-7 (Year: 2013).*

Nishi, The impact of heterojunction formation temperature on obtainable conversion efficiency in n-ZnO/p-Cu2O solar cells, Thin Solid Films 528 (2013) 72-76 (Year: 2013).*

Kaur, "All-oxide solar cells based on electrodeposited Cu2O absorber and atomic layer deposited ZnMgO on precious-metal-free electrode" Solar Energy Materials & Solar Cells 161 (2017) 449-459, published online Dec. 2016 (Year: 2016).*

Shibasaki, "Highly transparent Cu2O absorbing layer for thin film solar cells" Appl. Phys. Lett. 119, 242102 (2021) (Year: 2021).*

Tadatsugu Minami et al., "Efficiency Enhancement Using a $Zn_{1-x}Ge_x$-O Thing Film as an N-Type Window Layer in $Cu_2O$-Based Heterojunction Solar Cells", Applied Physics Express 9, 052301 (2016) (5 pages).

H. Solache-Carranco et al., "Photoluminescence and X-ray diffraction studies on $Cu_2O$", Journal of Luminescence 129 (2009), pp. 1483-1487.

Takayuki Ito et al., "Detailed Examination of Relaxation Processes of Excitons in Photoluminescence Spectra of Cu2O", Journal of the Physical Society of Japan, vol. 66, No. 7, Jul. 1997, pp. 2185-2193.

Masaya Ichimura, et al., "Band Alignment at the Cu2O/ZnO Heterojunction" Japanese Journal of Applied Physics, vol. 50(2011) 051002.

Pavan K. Pagare, et al., "Effect of deposition potential on efficiency of TiO2/Cu2O photoelectrochemical cells", Journal of Materials Science: Materials in Electronics, 2018, vol. 29, pp. 8473-8479.

Florin Dragan, et al., "Optical Modeling and Simulation of Tandem Metal Oxide Solar Cells", Annals of West University of Timisoara Physics, vol. LX, 2018, pp. 56-66.

Junqiang Li, et al., ("Probing Defects in Nitrogen-Doped $Cu_2O$"), Scientific Reports, vol. 4, Article No. 7240, Published: Nov. 28, 2014, (7 pages).

E. Camacho-Espinosa, et al., ("Stability of Sputter Deposited Cuprous Oxide ($Cu_2O$) Subjected to Ageing Conditions for Photovoltaic Applications"), Journal of Applied Physics 123, Published Online: Feb. 26, 2018, (7 pages).

Kirstin Bergum et al., "Thin film $Cu_2O$ for solar cell applications", IEEE 43rd Photovoltaic Specialists Conference (PVSC), 2016, pp. 2770-2773.

* cited by examiner

SOLAR CELL, MULTI-JUNCTION SOLAR CELL, SOLAR CELL MODULE, AND SOLAR POWER GENERATION SYSTEM

CROSS-REFERENCE TO RELATED APPLICATION

This application is based upon and claims the benefit of priority from Japanese Patent Applications No. 2018-175274, filed on Sep. 19, 2018, and No. 2019-033073, filed on Feb. 26, 2019; the entire contents of which are incorporated herein by reference.

FIELD

Embodiments described herein relate generally to a solar cell, a multi-junction solar cell, a solar cell module, and a solar power generation system.

BACKGROUND

A multi-junction (tandem) solar cell is a solar cell having a higher efficiency. The tandem solar cell can use a cell with high spectral sensitivity for each wavelength band, and therefore can have a higher efficiency than a single junction solar cell. In addition, as a top cell of the tandem solar cell, a cuprous oxide compound made of an inexpensive material and having a wide band gap has been expected. However, an efficiency of about 8% has been reported for a cuprous oxide solar cell manufactured by oxidizing a copper foil, but this value is lower than a theoretical critical efficiency. A reason for this is considered to be as follows. That is, a heterogeneous phase such as copper oxide on an outermost surface is removed by etching after a copper foil is oxidized, but the heterogeneous phase cannot be completely removed, and an element constituting an etching solution remains. Therefore, a favorable pn junction cannot be formed. In this method, after a foil having a thickness of about 0.1 mm is oxidized, the foil needs to be polished so as to have a thickness of about 20 μm. This makes it difficult to increase the area.

Meanwhile, there is an example in which a thin film is formed by a method using a reaction in a liquid phase or the like, but an efficiency is about 4% at a maximum. A main cause for this is considered to be that, not only a heterogeneous phase but also impurities contained in a solution are incorporated into a film to serve as a recombination center of photoexcited carriers. Such a thin film cannot be used for a top cell of the tandem solar cell because of absorbing also light having a wavelength of 600 nm or more which is not originally absorbed by a thin film. In general, a sputtering method is well known as a method for manufacturing a thin film with a small amount of contaminated impurities, and there is a reported example in which a thin film has been manufactured by this method. However, a conversion efficiency is 1% or less. A reason for this is considered to be that, a heterogeneous phase of copper or copper oxide is easily generated even without contamination of impurities and pure cuprous oxide is not easily obtained.

DETAILED DESCRIPTION

Hereinafter, preferred embodiments will be described in detail with reference to the accompanying drawings.

According to one embodiment, a solar cell includes a first electrode, a second electrode, and a photoelectric conversion layer disposed between the first electrode and the second electrode. In a case where a photoluminescence spectrum of the photoelectric conversion layer is measured at a temperature of 100 K or lower, a first maximum value (A) which is a maximum value of emission intensity in a wavelength range of more than 650 nm and 1000 nm or less is 100 times or less of a second maximum value (B) which is a maximum value of emission intensity in a wavelength range of 600 nm or more and 650 nm or less ($A \leq 100B$).

First Embodiment

Figure 1:
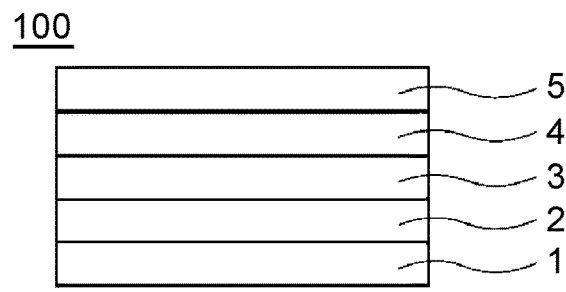
FIG. 1 is a conceptual cross-sectional view of a solar cell according to an embodiment.

A first embodiment relates to a solar cell. FIG. 1 shows a conceptual diagram of a solar cell 100 according to the first embodiment. As shown in FIG. 1, the solar cell 100 according to the present embodiment includes a substrate 1, a first electrode 2 on the substrate 1, a photoelectric conversion layer 3 on the first electrode 2, an n-type layer 4 on the photoelectric conversion layer 3, and a second electrode 5 on the n-type layer 4. An intermediate layer (not shown) may be included between the first electrode 2 and the photoelectric conversion layer 3 or between the n-type layer 4 and the second electrode 5.

(Substrate)

It is desirable to use white sheet glass as the substrate 1 according to the embodiment. It is also possible to use general glass such as quartz, soda lime glass, or chemically tempered glass, a metal plate such as stainless steel (SUS), W, Ta, Al, Ti, or Cr, or a resin such as polyimide or an acrylic resin.

(First Electrode)

The first electrode 2 according to the embodiment is a layer existing between the substrate 1 and the photoelectric conversion layer 3. In FIG. 1, the first electrode 2 is in direct contact with the substrate 1 and the photoelectric conversion layer 3. As the first electrode 2, a transparent conductive film or a laminate of a metal film, a transparent conductive film, and a metal film is preferable. Examples of the transparent conductive film include indium tin oxide (ITO), Al-doped zinc oxide (AZO), boron-doped zinc oxide (BZO), gallium doped zinc oxide (GZO), fluorine-doped tin oxide (FTO), antimony-doped tin oxide (ATO), titanium-doped indium oxide (ITiO), indium zinc oxide (IZO), indium gallium zinc oxide (IGZO), Ta-doped tin oxide ($SnO_2$:Ta), Nb-doped tin oxide ($SnO_2$:Nb), W-doped tin oxide ($SnO_2$:W), Mo-doped tin oxide ($SnO_2$:Mo), F-doped tin oxide ($SnO_2$:F), and hydrogen-doped indium oxide (IOH), and are not particularly limited. The transparent conductive film may be a laminated film having a plurality of films, and a film such as tin oxide may be included in the laminated film in addition to the above oxide. Examples of a dopant into a film such as tin oxide include In, Si, Ge, Ti, Cu, Sb, Nb, F, Ta, W, Mo, F, and Cl, and are not particularly limited. Examples of the metal film include films of Mo, Au, Cu, Ag, Al, Ta, and W, and are not particularly limited. The first electrode 2 may be an electrode having a dot-like, line-like, or mesh-like metal disposed on the transparent conductive film. At this time, the dot-like, line-like, or mesh-like metal is disposed between the transparent conductive film and the photoelectric conversion layer 3 or on the transparent conductive film on the opposite side to the photoelectric conversion layer 3. The dot-like, line-like, or mesh-like metal preferably has an aperture ratio of 50% or more with respect to the transparent conductive film. Examples of the dot-like, line-like, or mesh-like metal include Mo, Au, Cu, Ag, Al, Ta, and W, and are not particularly limited.

For the first electrode 2, a metal substrate may be used in place of the transparent conductive film. Examples of the metal substrate include W, Cr, Ti, Ta, Al, and SUS (for example, SUS 430). On the metal substrate, a photoelectric conversion layer described later may be directly formed (Photoelectric conversion layer)

The photoelectric conversion layer 3 according to the embodiment is a p-type compound semiconductor layer. The photoelectric conversion layer 3 is a layer existing between the first electrode 2 and the n-type compound semiconductor layer 4. Incidentally, hereinafter, the n-type compound semiconductor layer is referred to as an n-type layer. In FIG. 1, the photoelectric conversion layer 3 is in direct contact with the first electrode 2 and the n-type layer 4. The photoelectric conversion layer 3 is a layer containing cuprous oxide. Cuprous oxide in the photoelectric conversion layer 3 is non-doped or doped cuprous oxide. Cuprous oxide generally has a thickness of 500 nm or more and 0.3 mm or less, but the thickness is not limited thereto. Since cuprous oxide is inexpensive compared to a compound having a chalcopyrite structure, the solar cell 100 can reduce cost thereof. Cuprous oxide has a band gap of about 2.1 eV and has a wide band gap. In a case where the photoelectric conversion layer 3 of the solar cell 100 according to the present embodiment has a wide band gap, when a solar cell having the narrow band gap photoelectric conversion layer 3 such as Si is used as a bottom cell to form multi-junction, the solar cell 100 according to the first embodiment has high transmittance of light having a wavelength contributing to power generation on a bottom cell side. Therefore, the solar cell 100 according to the first embodiment is preferable in that the amount of power generation on the bottom cell side is high. In a case where the solar cell 100 according to the first embodiment is used as a multi-junction solar cell, the solar cell 100 according to the first embodiment is preferably disposed on a light incident side.

Here, a method for manufacturing the photoelectric conversion layer 3 included in the solar cell according to the present embodiment will be described.

The photoelectric conversion layer 3 is formed by sputtering. First, by supplying, for example, RF power from a high frequency power supply to a target of oxygen-free copper having a purity of 4 N or more in a mixed gas of Ar and oxygen, a thin film of cuprous oxide can be obtained. Other power such as a DC power supply may be supplied instead of the RF power supply. At this time, existence of an oxide on at least a part of an electrode, for example, a substrate during sputtering, makes it possible to appropriately suppress a reaction between oxygen and the electrode (corresponding to the substrate at the time of film formation) at the time of formation of cuprous oxide, and makes it easy to obtain a favorable crystal. For example, use of a transparent conductive oxide makes use thereof as an electrode possible, and therefore is desirable from a viewpoint of ease of configuration. Therefore, an oxide preferably exists on at least a part of the electrode. Power used for sputtering may be a direct current. Incidentally, at this time, the substrate is heated to 400° C. or higher and 700° C. or lower, preferably 450° C. or higher and 550° C. or lower. In this way, a cuprous oxide thin film can be formed. A heterogeneous phase such as copper or copper oxide may be formed depending on a flow rate ratio between Ar and oxygen. In order to suppress formation of copper or copper oxide, for example, it is necessary to adjust a ratio between an Ar flow rate and an oxygen flow rate. Note that copper oxide is CuO.

Since sputtering is film formation under reduced pressure, sputtering is performed in an environment with almost no oxygen. If a film forming temperature of the photoelectric conversion layer 3 is high, metal is easily reduced. In order to manufacture cuprous oxide, moderate oxidation is necessary. Therefore, it is necessary to increase an oxidizing agent (i.e., oxygen) in an easily reducible environment having high temperature. In other words, because an environment is under an easily reducible atmosphere with high temperature, it is necessary to increase an oxygen flow rate. When the photoelectric conversion layer 3 is formed at a high temperature, also by increasing an oxygen flow rate, it is possible to obtain the photoelectric conversion layer 3 having high quality.

For a substrate on which cuprous oxide is to be formed, a transparent component is preferably used. This is because by using a transparent component, it is possible to effectively use light in a wavelength range which cannot be absorbed by cuprous oxide on the opposite side to a light incident direction utilizing a fact that the component has a wide gap.

Copper or copper oxide becomes a heterogeneous phase in the photoelectric conversion layer 3 included in the solar cell according to the present embodiment. Therefore, by manufacturing a solar cell in which the number of these heterogeneous phases is reduced, the efficiency of the solar cell can be improved.

A heterogeneous phase included in the photoelectric conversion layer 3 largely affects a photoelectric conversion efficiency (also referred to as a conversion efficiency) of the solar cell. As described above, existence of a heterogeneous phase may serve as a recombination center of photoexcited carriers to reduce conversion efficiency, or may reduce the quality of the photoelectric conversion layer 3 itself. This is because copper-derived leakage or the like occurs to deteriorate a fill factor (FF). Furthermore, this is because promotion of recombination or the like adversely affects the entire cell characteristic in a case where copper oxide is contained. In addition, absorption of light in an unintended wavelength range leads to reduction in conversion efficiency of a bottom cell in a case where a multi-junction solar cell described later is formed.

In order to measure a heterogeneous phase existing in the photoelectric conversion layer 3 of the solar cell, analysis is performed by an X-ray diffraction method. Even in a case where no heterogeneous phase is detected in the photoelectric conversion layer 3, a high conversion efficiency is not necessarily obtained. This is because a heterogeneous phase which cannot be measured by the X-ray diffraction method exists. Therefore, a photoluminescence spectrum of a solar cell manufactured is measured using a photo luminescence method (PL method).

The PL method is an analytical method for examining secondary emission by irradiating a thin film with light having energy equal to or higher than a band gap. Therefore, by using the PL method, the film quality of the photoelectric conversion layer 3 of the solar cell can be examined. The better the film quality of the photoelectric conversion layer 3 is, the higher the peak intensity is measured. By measuring the photoluminescence spectrum, it is possible to measure the quality of the photoelectric conversion layer 3 of the solar cell, for example, a heterogeneous phase, a defect, and the like.

In a photoluminescence spectrum of the solar battery at a cryogenic temperature, a maximum value (A) of emission intensity in a wavelength range of more than 650 nm and 1000 nm or less is preferably 100 times or less of a maximum value (B) of emission intensity in a wavelength range of 600 nm or more and 650 nm or less (A≤100B). The emission intensity in a wavelength range of 650 nm or more is due to oxygen deficiency or copper deficiency in cuprous oxide, and the emission intensity in a wavelength range of 600 nm or more and 650 nm or less is due to band edge emission of cuprous oxide. Therefore, by setting a maximum value of emission intensity in a wavelength range of more than 650 nm and 1000 nm or less to 100 times or less of a maximum value of emission intensity in a wavelength range of 600 nm or more and 650 nm or less, a high conversion efficiency can be achieved. In addition, 30 times or less is more preferable (A≤30B). This is because, by setting a maximum value of emission intensity in a wavelength range of more than 650 nm and 1000 nm or less to 30 times or less of a maximum value of emission intensity in a wavelength range of 600 nm or more and 650 nm or less, recombination of photoexcited carriers can be further prevented, and therefore a higher conversion efficiency can be achieved. Furthermore, 1.5 times or less is still more preferable (A≤1.5B). This is because a higher conversion efficiency can be achieved due to the small number of heterogeneous phases, and recombination of photoexcited carriers can be prevented. If a maximum value (A) of emission intensity in a wavelength range of more than 650 nm and 1000 nm or less is more than 100 times a maximum value (B) of emission intensity in a wavelength range of 600 nm or more and 650 nm or less (A>100B), a conversion efficiency is reduced, and this is not preferable.

A method for measuring a photoluminescence spectrum of a solar cell is as follows.

For measurement of a PL intensity ratio, first, a solar cell is divided into four equal parts in each of longitudinal and lateral directions. Next, by excluding a scribed portion, five points in a portion where the photoelectric conversion layer 3 exists are selected as measurement points, and a PL intensity ratio at each of the points is measured. By averaging the PL intensity ratios at these five measurement points, an average PL intensity ratio can be determined. These measurement points are selected from a range of 5% or less from intersections of lines obtained by equally dividing the solar cell into four equal parts in each of longitudinal and lateral directions with respect to the longitudinal and lateral lengths of the solar cell to be measured. Note that a measurement range is set within a narrower range than a scribe interval.

For a PL intensity ratio of cuprous oxide, laser light having a wavelength of 532 nm can be used. If laser light having an excessively short wavelength is used, a signal derived from a portion other than the photoelectric conversion layer 3 may be detected.

Figure 2:
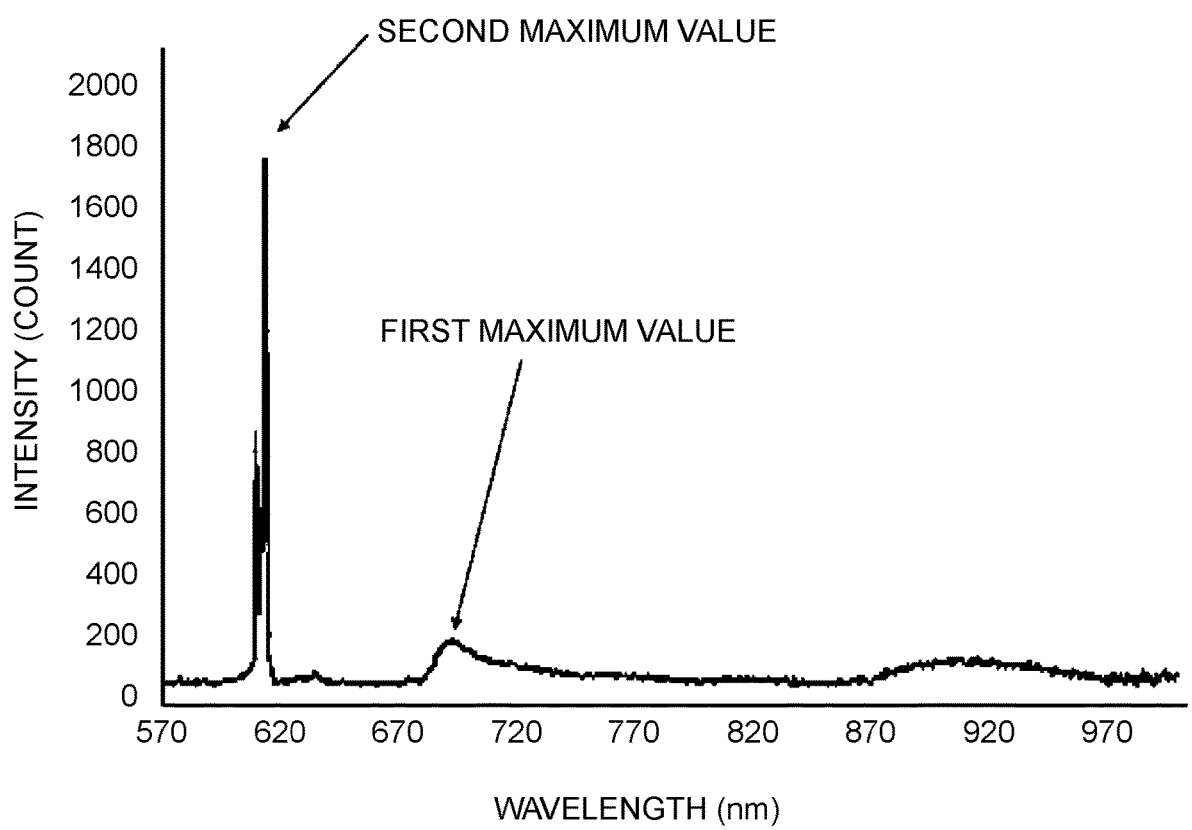
FIG. 2 is a graph showing an example of measurement of a photoluminescence spectrum of a solar cell according to a first embodiment.

Therefore, it is desirable to use a light source having energy a little higher than the band gap of the photoelectric conversion layer 3. For example, a solar cell is cut into about a 1 cm² square around a measurement point and cooled to about 10 K using a cryostat. The photoelectric conversion layer 3 is irradiated with a 532 nm YAG laser (excitation light intensity: 0.2 mW) using a microscopic photoluminescence measurement apparatus, for example, a model: LabRAM-HR PL apparatus manufactured by Horiba Ltd. Measurement is performed by setting integration time to five seconds and setting integration number to three times. A hole diameter is 100 μm, and an objective lens has a magnification of 15 times. CCD is used for a detector. This makes it possible to obtain a photoluminescence spectrum as shown in FIG. 2. By averaging the PL intensity ratios at these five measurement points, an average PL intensity ratio can be determined.

When constituent elements of the photoelectric conversion layer 3 included in the solar cell according to the first embodiment are measured by X-ray photoelectron spectroscopy (XPS), a peak of cuprous oxide exists in a range in which a binding energy value is 930 eV or more and 934 eV or less. The peak of cuprous oxide observed in a range in which a binding energy value is 930 eV or more and 934 eV or less, obtained by measuring the photoelectric conversion layer 3 by XPS, is considered to include a Cu(0) peak considered to be derived from zerovalent copper constituting metal copper, a Cu(I) peak considered to be derived from monovalent copper constituting cuprous oxide, and a Cu(II) peak derived from divalent copper constituting copper oxide (cupric oxide). Therefore, in a case where the photoelectric conversion layer 3 having the small number of heterogeneous phases is measured by XPS, when no other peak appears and the Cu(I) peak derived from cuprous oxide is a single peak, an almost symmetrical form about the peak top is obtained.

Figure 3:
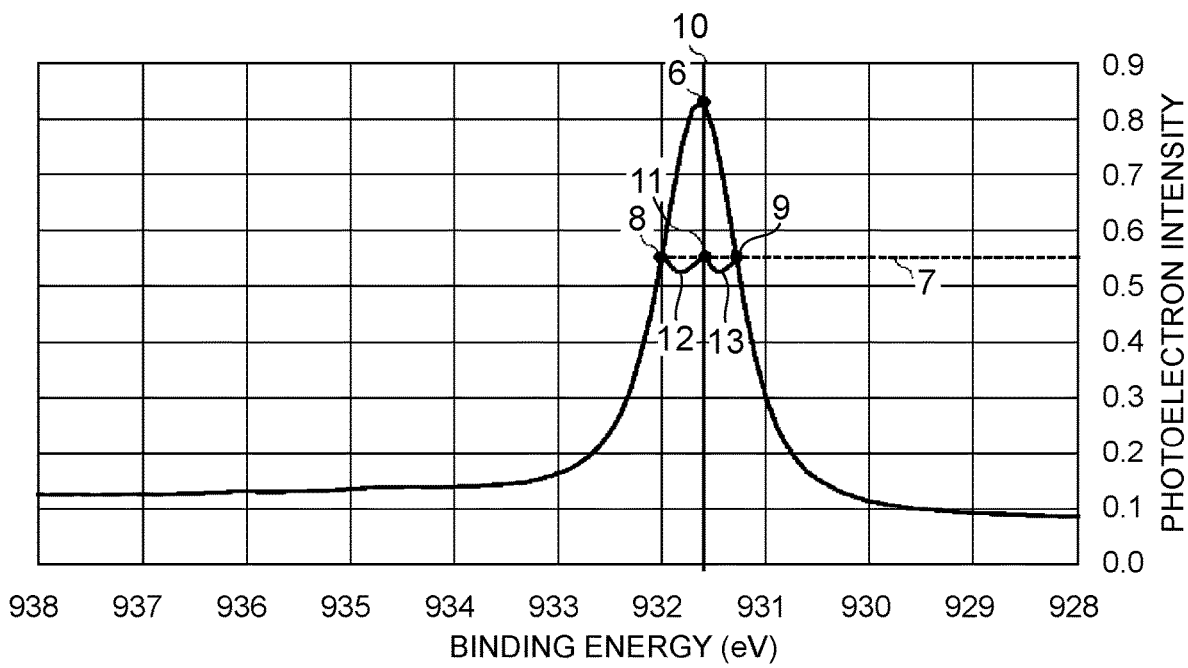
FIG. 3 is a schematic diagram of a method for measuring a photoelectric conversion layer using X-ray photoelectron spectroscopy.

FIG. 3 is a schematic diagram of a method for measuring the photoelectric conversion layer 3 using X-ray photoelectron spectroscopy. Description will be given with reference to FIG. 3. First, when the photoelectric conversion layer 3 included in the solar cell according to the first embodiment is analyzed by XPS, in a peak of cuprous oxide observed in a range in which a binding energy value is 930 eV or more and 934 eV or less, there are a first intersection 8 and a second intersection 9 where a horizontal line 7 passing through a value of ⅔ of a maximum value, that is, a value of a peak top 6 of cuprous oxide intersects with the peak of cuprous oxide. There is a third intersection 11 where a perpendicular line 10 extending from the peak top 6 to the horizontal line 7 intersects with the horizontal line 7. A difference between a first length 12 formed by the first intersection 8 and the third intersection 11 and a second length 13 formed by the second intersection 9 and the third intersection 11 is examined. For convenience, the first length 12 is referred to as L1, and the second length 13 is referred to as L2. This measurement is performed at a measurement point set in a similar manner to measurement of the PL intensity ratio. Specifically, a solar cell is divided into four equal parts in each of longitudinal and lateral directions. Next, by excluding a scribed portion, five points in a portion where the photoelectric conversion layer 3 exists are selected as measurement points, and measurement is performed by XPS at each of the points. At each of these five measurement points, a ratio of a difference between the first length (L1) and the second length (L2) (absolute value of a difference of L1-L2/a longer value of L1 and L2) is determined. For example, when L1 is longer than L2, L1 is the longer value used as a denominator of the ratio. The absolute value of a difference of L1-L2 is |L1-L2| used as a numerator of the ratio. By averaging respective ratios of the difference, an average of the ratios of the difference can be determined. These measurement points are selected from a range of 5% or less from intersections of lines obtained by equally dividing the solar cell into four equal parts in each of longitudinal and lateral directions with respect to the longitudinal and lateral lengths of the solar cell to be measured. Note that a measurement range is set within a narrower range than a scribe interval. The smaller number of heterogeneous phases makes the difference between the first length and the second length smaller.

Therefore, a case where the average of the ratios of a difference between the first length 12 formed by the first intersection 8 and the third intersection 11 and the second length 13 formed by the second intersection 9 and the third intersection 11 is 15% or less can mean that the number of heterogeneous phases included in the photoelectric conversion layer 3 is sufficiently small. Therefore, it is possible to prevent a heterogeneous phase from serving as a recombination center of photoexcited carriers to reduce a conversion efficiency, to prevent deterioration of the quality of the photoelectric conversion layer 3 itself, and to improve the efficiency of a solar cell. Furthermore, a case where the average of the ratios of a difference between the first length 12 formed by the first intersection 8 and the third intersection 11 and the second length 13 formed by the second intersection 9 and the third intersection 11 is 10% or less indicates that the number of heterogeneous phases included in the photoelectric conversion layer 3 is small, and therefore can further improve the efficiency of a solar cell.

Incidentally, as described above, when the photoelectric conversion layer 3 is measured by XPS, in order to make it possible to analyze a state in the photoelectric conversion layer 3, measurement is preferably performed after an n-type layer on the photoelectric conversion layer 3 and the second electrode 5 thereon described later are removed by Ar ion etching or the like.

(n-Type Layer)

The n-type layer 4 is a layer existing between the photoelectric conversion layer 3 and the second electrode 5. In FIG. 1, the n-type layer 4 is in direct contact with the photoelectric conversion layer 3 and the second electrode 5. It is desirable that the n-type layer 4 to be formed on the photoelectric conversion layer 3 is free from excessive oxygen during formation thereof. This is because due to existence of oxygen in the n-type layer 4, oxygen contained in the n-type layer 4 may react with cuprous oxide contained in the photoelectric conversion layer 3 at an interface between the photoelectric conversion layer 3 and the n-type layer 4 to generate a heterogeneous phase such as copper oxide. This heterogeneous phase is more likely to be generated as the n-type layer 4 contains more oxygen. Therefore, it is desirable that excessive oxygen does not exist in the n-type layer 4 during formation thereof. The n-type layer 4 may include a plurality of layers including a buffer layer and the like. In formation of the n-type layer 4, for example, the n-type layer 4 can be formed by co-sputtering sputtering targets of ZnO and $GeO_2$ in an Ar gas flow.

The n-type layer 4 preferably has a thickness of 5 nm or more and 100 nm or less. If the thickness of the n-type layer 4 is 5 nm or less, leakage current may be generated when the n-type layer 4 has poor coverage to deteriorate characteristics. If the thickness of the n-type layer 4 exceeds 100 nm, characteristics may be deteriorated due to an excessive increase in resistance of the n-type layer 4, or short-circuit current may decrease due to a decrease in transmittance. Therefore, the thickness of the n-type layer 4 is more preferably 10 nm or more and 50 nm or less. In order to achieve a film with good coverage, the n-type layer 4 preferably has a surface roughness of 5 nm or less. When the quality of the n-type layer is high, a solar cell which operates even with a film thickness of about 200 nm can be formed.

A conduction band offset ($\Delta E = Ecp - Ecn$) which is a difference between the position (Ecp (eV)) of a conduction band minimum (CBM) of the photoelectric conversion layer 3 and the position (Ecn (eV)) of a conduction band minimum of the n-type layer 4 is preferably −0.2 eV or more and 0.6 eV or less ($-0.2 \text{ eV} \leq \Delta E \leq +0.6 \text{ eV}$). If the conduction band offset is larger than 0, the conduction band at a pn junction interface is discontinuous, and a spike is generated. If the conduction band offset is smaller than 0, the conduction band at a pn junction interface is discontinuous, and a cliff is generated. Both the spike and the cliff are barriers to photogenerated electrons, and therefore are preferably smaller. Therefore, the conduction band offset is more preferably 0.0 eV or more and 0.4 eV or less ($0.0 \text{ eV} \leq \Delta E \leq +0.4 \text{ eV}$). However, this is not the case when conduction is performed using an in-gap level. The position of CBM can be estimated using the following method. A valence band maximum (VBM) is actually measured by photoelectron spectroscopy which is an evaluation method of an electron occupancy level. Subsequently, CBM is calculated by assuming a band gap of a material to be measured. However, at an actual pn junction interface, an ideal interface is not maintained due to generation of mutual diffusion or cation vacancy, and therefore there is a high possibility that the band gap may change. Therefore, CBM is also preferably evaluated by inverse photoelectron spectrometry directly using a reverse process of photoelectron emission. Specifically, an electronic state of a pn junction interface can be evaluated by repeating low energy ion etching and photoelectron/inverse photoelectron spectrometry on a surface of a solar cell.

(Second Electrode)

In FIG. 1, the second electrode 5 is in direct contact with the n-type layer 4. As the second electrode 5, a transparent conductive film is preferable. A similar material to the first electrode 2 is preferably used for the transparent conductive film.

The composition and the like of the solar cell 100 are determined by X-ray photoelectron spectroscopy (XPS) and secondary ion mass spectrometry (SIMS). The thickness and particle size of each layer are determined by performing observation of a cross section of the solar cell 100 with a transmission electron microscope (TEM) at 100,000 times. The surface roughness is determined by performing observation with an atomic force microscope (AFM).

(Third Electrode)

A third electrode according to the embodiment is an electrode of the solar cell 100 and is a metal film formed on the second electrode 5 on the opposite side to the photoelectric conversion layer 3. As the third electrode, a conductive metal film such as Ni or Al can be used. The third electrode has a film thickness, for example, of 200 nm or more and 2000 nm or less. In a case where a resistance value of the second electrode 5 is low and a series resistance component is negligible, the third electrode may be omitted.

(Antireflection Film)

An antireflection film according to the embodiment is a film for easily introducing light into the photoelectric conversion layer 3. The second electrode 5 and the third electrode have two sides respectively. One side thereof opposes to the photoelectric conversion layer 3, and the other side thereof opposes to the antireflection film. The antireflection film is formed on the second electrode 5 or the third electrode on the opposite side to the photoelectric conversion layer 3. As the antireflection film, for example, it is desirable to use $MgF_2$ or $SiO_2$. Incidentally, in the embodiment, the antireflection film can be omitted. It is necessary to adjust the film thickness according to the refractive index of each layer, but it is preferable to perform deposition at about 70 to 130 nm (preferably 80 to 120 nm).

Here, a method for manufacturing the solar cell according to the present embodiment will be described.

(Manufacturing Method)

Figure 4:
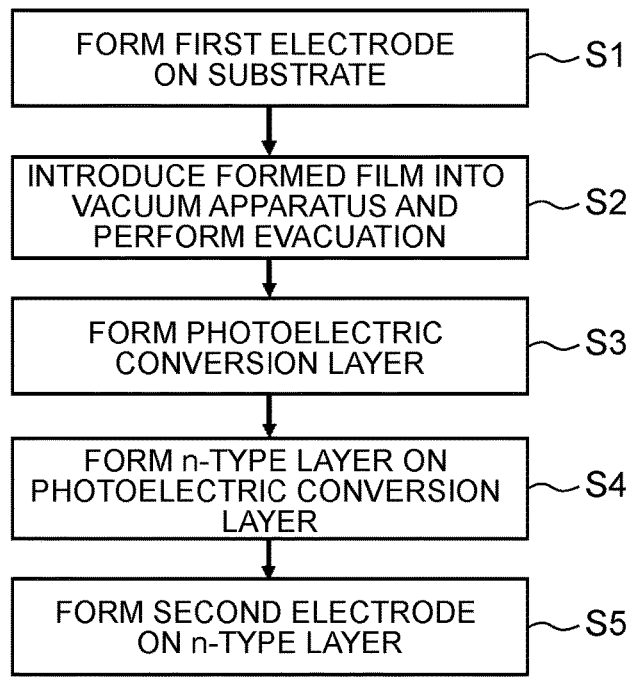
FIG. 4 is a flowchart of a method for manufacturing the solar cell according to the first embodiment.

FIG. 4 shows a flowchart of the method for manufacturing the solar cell according to the present embodiment.

A material to be the first electrode 2 is formed on the substrate 1 by sputtering or the like (S1). Next, the formed film is introduced into a vacuum apparatus, and evacuation is performed (S2). A material to be the photoelectric conversion layer 3 is formed under vacuum conditions by sputtering or the like (S3). After the photoelectric conversion layer 3 is formed, the n-type layer 4 is formed (S4). Thereafter, a material to be the second electrode 5 is formed by sputtering or the like (S5). When the second electrode 5 is formed, the second electrode 5 may be a super straight type or a substrate type.

The method for manufacturing the n-type layer 4 is not limited to the above method. Examples of the method include chemical bath deposition (CBD), chemical vapor deposition (CVD), atomic layer deposition (ALD), a coating method, and an electrodeposition method.

The solar cell according to the present embodiment includes a first electrode, a second electrode, and a photoelectric conversion layer disposed between the first electrode and the second electrode. In a case where a photoluminescence spectrum of the photoelectric conversion layer is measured at a temperature of 100 K or lower, a first maximum value (A) which is a maximum value of emission intensity in a wavelength range of more than 650 nm and 1000 nm or less is 100 times or less of a second maximum value (B) which is a maximum value of emission intensity in a wavelength range of 600 nm or more and 650 nm or less (A≤100B). Therefore, it is possible to prevent a heterogeneous phase from serving as a recombination center of photoexcited carriers to reduce a conversion efficiency, to prevent deterioration of the quality of the photoelectric conversion layer itself, and to form a solar cell having a high efficiency.

Second Embodiment

Figure 5:
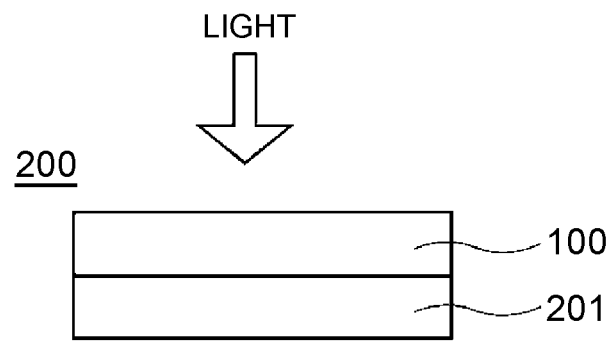
FIG. 5 is a conceptual cross-sectional view of a multi-junction solar cell according to a second embodiment.

A second embodiment relates to a multi-junction solar cell. FIG. 5 shows a conceptual cross-sectional view of a multi-junction solar cell 200 according to the second embodiment. The multi-junction solar cell 200 shown in FIG. 5 includes the solar cell (first solar cell) 100 according to the first embodiment on a light incident side and a second solar cell 201. A photoelectric conversion layer of the second solar cell 201 has a smaller band gap than the photoelectric conversion layer 3 of the solar cell 100 according to the first embodiment. Note that the multi-junction solar cell according to the second embodiment also includes a solar cell in which three or more solar cells are bonded.

The band gap of the photoelectric conversion layer 3 of the solar cell 100 according to the first embodiment is about 2.0 eV. Therefore, the band gap of the photoelectric conversion layer of the second solar cell 201 is preferably 1.0 eV or more and 1.4 eV or less. The photoelectric conversion layer of the second solar cell 201 is preferably a compound semiconductor layer including one or more of a CIGS-based compound with a high In content ratio, a CIT-based compound with a high In content ratio, a CdTe-based compound, and a copper oxide-based compound or crystalline silicon.

By using the solar cell according to the first embodiment as the first solar cell, it is possible to prevent reduction in conversion efficiency of a bottom cell (second solar cell) due to absorption of light in an unintended wavelength range in the first solar cell. Therefore, it is possible to form a multi-junction solar cell having a high efficiency.

Third Embodiment

Figure 6:
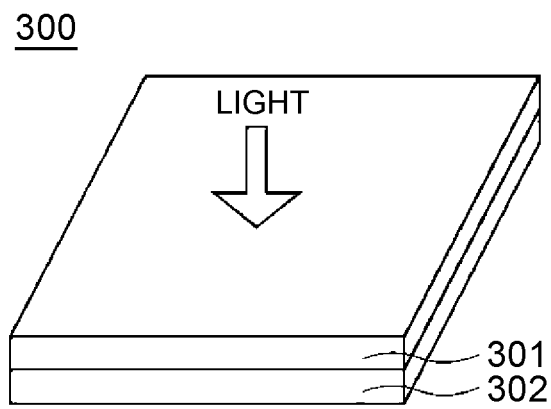
FIG. 6 is a conceptual diagram of a solar cell module according to a third embodiment.

A third embodiment relates to a solar cell module. FIG. 6 shows a conceptual perspective view of a solar cell module 300 according to the third embodiment. The solar cell module 300 in FIG. 6 is a solar cell module in which a first solar cell module 301 and a second solar cell module 302 are laminated. The first solar cell module 301 is on a light incident side, and the solar cell 100 according to the first embodiment is used therefor. For the second solar cell module 302, the second solar cell 201 is preferably used.

Figure 7:
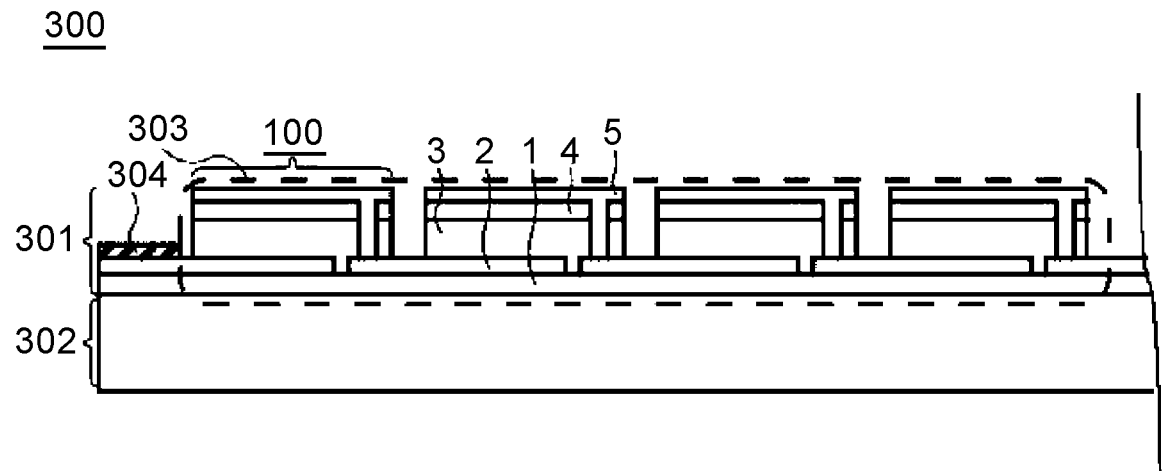
FIG. 7 is a conceptual cross-sectional view of the solar cell module according to the third embodiment.

FIG. 7 shows a conceptual cross-sectional view of the solar cell module 300. In FIG. 7, the structure of the first solar cell module 301 is shown in detail, and the structure of the second solar cell module 302 is not shown. In the second solar cell module 302, the structure of the solar cell module is appropriately selected according to a photoelectric conversion layer or the like of a solar cell used. The solar cell module in FIG. 7 includes a plurality of submodules 303 in which a plurality of the solar cells 100 is arranged in a lateral direction and electrically connected in series, surrounded by a broken line, and the plurality of submodules 303 is electrically connected in parallel or in series.

The solar cells 100 are scribed, and in the adjacent solar cells 100, a second electrode 5 on an upper side of one solar cell is connected to a first electrode 2 on a lower side of another solar cell (adjacent to the one solar cell). Like the solar cell 100 according to the first embodiment, the solar cell 100 according to the third embodiment also includes a substrate 1, the first electrode 2, a photoelectric conversion layer 3, an n-type layer 4, and the second electrode 5.

If output voltage varies depending on each module, current may flow back to a low voltage portion, or excess heat may be generated, and therefore this leads to a decrease in output of the module.

By using the solar cell of the first embodiment, a solar cell suitable for each wavelength band can be used. Therefore, it is possible to generate power more efficiently than in a case of using a single unit, and the output of the whole module increases. Therefore, this is desirable.

If the conversion efficiency of the whole module is high, an energy ratio at which irradiation light energy becomes heat can be reduced. Therefore, it is possible to suppress reduction in efficiency due to rise in temperature of the whole module.

Fourth Embodiment

Figure 8:
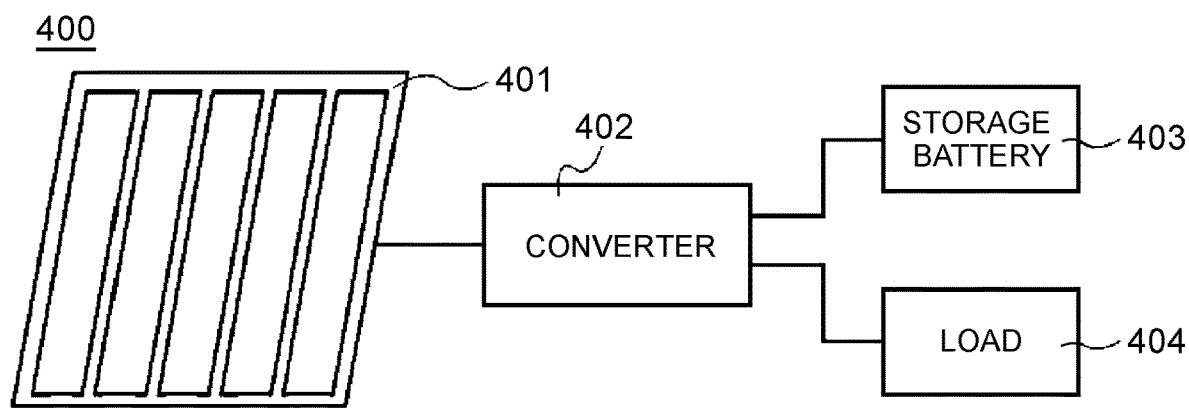
FIG. 8 is a conceptual diagram of a solar power generation system according to a fourth embodiment.

A fourth embodiment relates to a solar power generation system. The solar cell module 300 according to the third embodiment can be used as a power generator for generating power in the solar power generation system according to the fourth embodiment. The solar power generation system according to the embodiment generates power using a solar cell module, and specifically includes a solar cell module for generating power, a unit for converting generated electricity into power, a storage unit for storing generated electricity, and a load for consuming generated electricity. FIG. 8 shows a conceptual diagram of the configuration of a solar power generation system 400 according to the fourth embodiment. The solar power generation system in FIG. 8 includes a solar cell module 401 (300), a converter 402, a storage battery 403, and a load 404. Either one of the storage battery 403 and the load 404 may be omitted. The load 404 may have a configuration capable of utilizing electric energy stored in the storage battery 403. The converter 402 is an apparatus including a circuit or an element for performing voltage transformation or power conversion such as a DC-DC converter, a DC-AC converter, or an AC-AC converter. For the configuration of the converter 402, it is only required to adopt a suitable configuration according to power generation voltage, and the configurations of the storage battery 403 and the load 404.

A solar cell included in the submodule 303 (included in the solar cell module 300) which has received light generates power, and electric energy thereof is converted by the converter 402 and stored in the storage cell 403 or consumed by the load 404. To the solar cell module 401, a sunlight tracking drive apparatus for constantly directing the solar cell module 401 to the sun, a light collector for collecting sunlight, an apparatus for improving a power generation efficiency, and the like are preferably added.

The solar power generation system 400 is preferably used for real estate such as a residence, commercial facilities, and a factory, or used for movable items such as a vehicle, an aircraft, and an electronic device. An increase in the amount of power generation is expected by using the solar cell having excellent conversion efficiency according to the embodiment for the solar cell module 401.

Hereinafter, the present invention will be described more specifically based on Embodiments, but the present invention is not limited to the following Embodiments.

EMBODIMENTS

A top cell is manufactured, and a PL intensity ratio, an XPS value, and a conversion efficiency are measured.

Embodiment 1

On a white sheet glass substrate, an ITO transparent conductive film as a first electrode on a back side is deposited, and a $SnO_2$ transparent conductive film doped with Sb is deposited thereon. On the transparent first electrode, a film of a cuprous oxide compound is formed by heating at 450° C. by a sputtering method in an atmosphere having a ratio between oxygen and oxygen+argon gas ($O_2$/($Ar+O_2$) ratio) of 0.078. Thereafter, n-type $Z_{0.8}Ge_{0.2}O_x$ is deposited on the p cuprous oxide layer by a sputtering method at room temperature, and $MgF_2$ is deposited thereon as an antireflection film. Thereafter, an AZO transparent conductive film is deposited as a second electrode on a front surface side. At the time of depositing the second electrode on the front surface side, it is necessary to form a film at room temperature in order to suppress oxidation of oxide. For example, by using AZO, a film with low resistance can be obtained even at room temperature. A target of AZO preferably has a ratio of $Al_2O_3$ of about 2 wt % to 3 wt % with respect to ZnO, but is not limited thereto as long as having a sufficiently low resistance value and a high transmittance with respect to an element.

A method for measuring a PL intensity ratio is as follows.

A solar cell was divided into four equal parts in each of longitudinal and lateral directions, and five points are selected from intersections of lines obtained by dividing the solar cell into four equal parts in each of longitudinal and lateral directions. Measurement points were selected from a range of 5% or less from the intersections with respect to the longitudinal and lateral lengths of the solar cell to be measured, and a PL intensity ratio at each of the measurement points was measured. These measurement points were cooled to about 10 K using a cryostat, and a photoelectric conversion layer was irradiated with a 532 nm YAG laser (excitation light intensity: 0.2 mW) using a microscopic photoluminescence measurement apparatus (model: LabRAM-HR PL apparatus manufactured by Horiba Ltd.). In the irradiation, measurement was performed by setting integration time to five seconds and setting integration number to three times. A hole diameter was 100 μm, and an objective lens had a magnification of 15 times. An average PL intensity ratio was determined from a PL intensity ratio at each of the five measurement points and is shown in Table 1.

An XPS value was measured as follows.

In elemental analysis of a photoelectric conversion layer by XPS, first, a second electrode and an n-type layer were removed from a solar cell using Ar ion etching to expose a photoelectric conversion layer. Next, the exposed photoelectric conversion layer was measured using the following apparatus and measurement conditions. As a device used, AXIS Ultra DLD manufactured by Shimadzu Corporation was used. As an excitation source, monochro (Al-Kα) (15kV ×15mA) was used. As a measurement mode, spectrum was used for an analyser mode, and hybrid was used for a lens mode. A photoelectron extraction angle was set to 45°. A capture region was set to a range in which a binding energy value was 0 to 1200 eV for wide scan, and was set to a range of 926 to 942 eV of Cu2p and a range of 278 to 294 eV of C1s in which a main peak of cuprous oxide can be observed for narrow scan. At this time, pass energy was set to 160 eV for wide scan and was set to 10 eV for narrow scan. Measurement was performed such that a binding energy value was increased by every 0.1 eV. Charge correction was performed by setting a C1s peak of surface contaminated hydrocarbon to 284.8 eV. In this way, a photoelectric conversion layer was measured at five points by XPS, and an average of error ranges of each difference was determined. Results thereof are also summarized in Table 1. In Table 1, a case where an average range of difference ratios was within 10% was evaluated to be ⊙, a case where an average range of difference ratios was within 15% was evaluated to be O, and a case where an average range of difference ratios was larger than 15% was evaluated to be X.

A method for measuring a conversion efficiency is as follows.

Using a solar simulator simulating a light source of AM 1.5 G, the light quantity is adjusted such that the light quantity becomes 1 sun using a Si cell as a reference under the light source. The temperature is 25° C. When the horizontal axis indicates voltage and the vertical axis indicates current density, a point intersecting with the horizontal axis is Voc. Voltage sweep is performed from a value covering Voc with a voltmeter (for example, 1.6 V) up to a range in which short circuit current density (Jsc) can be measured (minus region, for example, −0.4 V), and a current value is measured at this time. A value obtained by dividing the current value by the area of a solar cell is a current density (mA/cm²), and a value of a current density at an applied voltage of 0 V is Jsc.

Efficiency (η) is calculated as follows.

$$\eta = Voc \times Jsc \times FF/P \times 100$$

P is incident power density by calibrating the simulated sunlight of AM 1.5 G with the reference solar cell.

FF is calculated as follows.

$$FF = Vmpp \times Jmpp/(Voc \times Jsc).$$

Vmpp and Jmpp are values of V and J at the point where the product of V×J is maximum.

At this time, Table 1 shows solar cell efficiencies (FFs) in other Embodiment and Comparative Examples calculated by using the value in Embodiment 1 as a reference.

Results of measurements for Embodiments 2 to 6 and Comparative Embodiments 1 to 4 described later are also summarized in Table 1. Results of measurements for Embodiments 7 to 14 and Comparative Embodiment 5 described later are also summarized in Table 2. Results of measurements for Embodiments 15 to 16 and Comparative Embodiments 6 to 7 described later are also summarized in Table 3.

Embodiments 2 to 6

Manufacture and measurement were performed in a similar manner to Embodiment 1 except that the ratio between oxygen and argon gas was set as shown in Table 1.

Comparative Example 1

Manufacture and measurement were performed in a similar manner to Embodiment 1 except that an oxygen gas flow existed in depositing the n-type layer.

Comparative Example 2

Manufacture and measurement were performed in a similar manner to Comparative Example 1 except that Zn+Ge was used as the target in depositing the n-type layer.

Comparative Example 3

Manufacture and measurement were performed in a similar manner to Comparative Example 1 except that ZnO+Ge was used as the target in depositing the n-type layer.

Comparative Example 4

Manufacture and measurement were performed in a similar manner to Comparative Example 1 except that Zn+GeO₂ was used as the target in depositing the n-type layer.

Embodiments 7 to 12

Manufacture and measurement were performed in a similar manner to Embodiment 1 except that tungsten (W) was used as the first electrode and the ratio between oxygen and argon gas was set as shown in Table 2.

Embodiment 13

Manufacture and measurement were performed in a similar manner to Embodiment 8 except that a film of the cuprous oxide compound was formed at 400° C.

Embodiment 14

Manufacture and measurement were performed in a similar manner to Embodiment 9 except that a film of the cuprous oxide compound was formed at 600° C.

Comparative Example 5

Manufacture and measurement were performed in a similar manner to Embodiment 7 except that an oxygen gas flow existed in depositing the n-type layer.

Embodiment 15

Manufacture and measurement were performed in a similar manner to Embodiment 1 except that a film of the cuprous oxide compound was formed at 400° C.

Embodiment 16

Manufacture and measurement were performed in a similar manner to Embodiment 1 except that a film of the cuprous oxide compound was formed at 600° C.

Comparative Example 6

Manufacture and measurement were performed in a similar manner to Embodiment 1 except that a film of the cuprous oxide compound was formed at 350° C.

Comparative Example 7

Manufacture and measurement were performed in a similar manner to Embodiment 1 except that a film of the cuprous oxide compound was formed at 750° C.

TABLE 1

| | Ratio of $O_2/(Ar + O_2)$ | PL intensity ratio | XPS | Efficiency ratio |
|---|---|---|---|---|
| Example 1 | 0.078 | 0.01 | ⊙ | 1 |
| Example 2 | 0.076 | 0.094 | ⊙ | 0.995 |
| Example 3 | 0.080 | 1.1 | ⊙ | 0.994 |
| Example 4 | 0.082 | 12 | ○ | 0.88 |
| Example 5 | 0.074 | 30 | ○ | 0.84 |
| Example 6 | 0.084 | 94 | ○ | 0.82 |
| Comparative Example 1 | 0.078 | 140 | X | 0.32 |
| Comparative Example 2 | 0.078 | 1432 | X | 0.02 |
| Comparative Example 3 | 0.078 | 983 | X | 0.1 |
| Comparative Example 4 | 0.078 | 516 | X | 0.14 |

TABLE 2

|  | Ratio of $O_2/(Ar + O_2)$ | PL intensity ratio | XPS | Efficiency ratio |
|---|---|---|---|---|
| Example 7 | 0.080 | 0.03 | ⊙ | 0.91 |
| Example 8 | 0.078 | 0.54 | ○ | 0.89 |
| Example 9 | 0.082 | 1.5 | ○ | 0.8 |
| Example 10 | 0.076 | 3.5 | ○ | 0.79 |
| Example 11 | 0.074 | 46 | ○ | 0.71 |
| Example 12 | 0.084 | 41 | ○ | 0.71 |
| Example 13 | 0.078 | 1.9 | ○ | 0.81 |
| Example 14 | 0.082 | 4.8 | ○ | 0.84 |
| Comparative Example 5 | 0.080 | 223 | X | 0.29 |

TABLE 3

|  | Ratio of $O_2/(Ar + O_2)$ | PL intensity ratio | XPS | Efficiency ratio |
|---|---|---|---|---|
| Example 1 | 0.078 | 0.01 | ⊙ | 1 |
| Example 15 | 0.078 | 0.31 | ⊙ | 0.995 |
| Example 16 | 0.078 | 24 | ○ | 0.81 |
| Comparative Example 6 | 0.078 | >2000 | X | X |
| Comparative Example 7 | 0.078 | X | X | X |

Tables 1 to 3 indicate that, when Embodiments 1 to 16 are compared with Comparative Examples 1 to 7, an excellent efficiency can be achieved by a fact that, in a case where a photoluminescence spectrum of the photoelectric conversion layer is measured at a temperature of 100 K or lower, a first maximum value (A) which is a maximum value of emission intensity in a wavelength range of more than 650 nm and 1000 nm or less is 100 times or less of a second maximum value (B) which is a maximum value of emission intensity in a wavelength range of 600 nm or more and 650 nm or less (A≤100B). Furthermore, Tables 1 to 3 indicate that a better efficiency can be achieved by a fact that, a first maximum value (A) which is a maximum value of emission intensity in a wavelength range of more than 650 nm and 1000 nm or less is 30 times or less of a second maximum value (B) which is a maximum value of emission intensity in a wavelength range of 600 nm or more and 650 nm or less (A≤30B).

In solar cells manufactured at the same temperature, the efficiency ratios in Embodiments 1 to 6 using transparent electrodes were higher than those in Embodiments 7 to 12 using metal electrodes. This is because existence of an oxide on at least a part of the first electrode can moderately suppress the reaction between oxygen and the electrode at the time of forming cuprous oxide.

In addition, a conversion efficiency of a solar cell can be improved also by a fact that, when a photoelectric conversion layer is analyzed by XPS, in a peak of cuprous oxide observed in a range in which a binding energy value is 930 eV or more and 934 eV or less, there are a first intersection and a second intersection where a horizontal line passing through a value of ⅔ of a peak top value of cuprous oxide intersects with the peak of cuprous oxide, there is a third intersection where a perpendicular line extending from the peak top to the horizontal line intersects with the horizontal line, and an average of ratios of a difference between a first length formed by the first intersection and the third intersection and a second length formed by the second intersection and the third intersection is 15% or less. This is because, due to the small number of heterogeneous phases existing in the photoelectric conversion layer, it is possible to prevent a heterogeneous phase from serving as a recombination center of photoexcited carriers to reduce a conversion efficiency, to improve the quality of the photoelectric conversion layer, and to prevent absorption of light in an unintended wavelength range. Therefore, a short circuit current density in the photoelectric conversion layer (p layer, cuprous oxide) can be improved. In addition, by forming a favorable interface, a defect level of the interface is reduced, and an open circuit voltage can be increased. Furthermore, by suppressing a leak component and forming a good contact, a fill factor is also improved, and an efficiency can be improved.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A solar cell comprising:
a substrate;
a first transparent electrode;
a second transparent electrode;
a p-type photoelectric conversion layer containing cuprous oxide disposed between the first transparent electrode and the second transparent electrode;
an n-type layer disposed between the p-type photoelectric conversion layer and the second transparent electrode, wherein
the p-type photoelectric conversion layer has a thickness of 500 nm or more and 0.3 mm or less,
at a temperature of 100 K or lower, the p-type photoelectric conversion layer has a photoluminescence spectrum exhibiting a first maximum value (A) which is a maximum value of emission intensity in a wavelength range of more than 650 nm and 1000 nm or less and that is 100 times or less of a second maximum value (B) which is a maximum value of emission intensity in a wavelength range of 600 nm or more and 650 nm or less (A≤100B), and wherein
the p-type photoelectric conversion layer as analyzed by X-ray photoelectron spectroscopy,
in a peak of the cuprous oxide observed in a range in which a binding energy value is 930 eV or more and 934 eV or less,
exhibits a first intersection and a second intersection where a horizontal line passing through a value of ⅔ of a peak top of the cuprous oxide intersects with the peak of the cuprous oxide, and
exhibits a third intersection where a perpendicular line extending from the peak top to the horizontal line intersects with the horizontal line, wherein
an average of ratios of a difference between a first length formed by the first intersection and the third intersection and a second length formed by the second intersection and the third intersection is 15% or less,
the first electrode is formed over the substrate, and
the p-type photoelectric conversion layer is formed over the first electrode.

2. The solar cell according to claim 1, wherein the first maximum value (A) is 30 times or less of the second maximum value (B) (A≤30B).

3. The solar cell according to claim 1, wherein the average of ratios of the difference is 10% or less.

4. The solar cell according to claim 1, wherein the p-type photoelectric conversion layer is in direct contact with the first transparent electrode, and
    a surface of the p-type photoelectric conversion layer opposite to a surface which is in direct contact with the first transparent electrode is in direct contact with the n-type layer.

5. The solar cell according to claim 1, wherein
the first electrode is formed on the substrate, and
the p-type photoelectric conversion layer is formed on the first electrode.

6. The solar cell according to claim 1, wherein
the first electrode is formed on and in contact with the substrate, and
the p-type photoelectric conversion layer is formed on and in contact with the first electrode.

7. The solar cell according to claim 1, wherein
the first electrode is formed on and in direct contact with the substrate, and
the p-type photoelectric conversion layer is formed on and in direct contact with the first electrode.

8. A solar cell module using the solar cell according to claim 1.

9. A solar power generation system for performing solar power generation using the solar cell module according to claim 8.

10. A multi-junction solar cell using the solar cell according to claim 1.

11. A solar cell module using the multi-junction solar cell according to claim 10.

12. A solar power generation system for performing solar power generation using the solar cell module according to claim 11.

* * * * *